United States Patent
Nakashima et al.

(10) Patent No.: US 6,375,758 B2
(45) Date of Patent: Apr. 23, 2002

(54) CLEANING AND DRYING METHOD AND APPARATUS FOR OBJECTS TO BE PROCESSED

(75) Inventors: Satoshi Nakashima, Kikusui-machi; Yuji Kamikawa, Koshi-machi; Kazuyuki Honda, Tosu, all of (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/097,097

(22) Filed: Jun. 12, 1998

(30) Foreign Application Priority Data

Jun. 17, 1997 (JP) .............................................. 9-175134

(51) Int. Cl.⁷ ................................................ B08B 3/00
(52) U.S. Cl. ............................... 134/30; 134/2; 134/21; 134/32; 134/902; 134/26
(58) Field of Search .............................. 134/2, 21, 26, 134/32, 30, 902

(56) References Cited

U.S. PATENT DOCUMENTS

| | | | |
|---|---|---|---|
| 4,911,761 A | | 3/1990 | McConnell et al. ........... 134/11 |
| 4,983,223 A | * | 1/1991 | Gessner ...................... 134/25.4 |
| 5,369,891 A | * | 12/1994 | Kamikawa ...................... 34/78 |
| 5,520,744 A | * | 5/1996 | Fujikawa et al. .............. 134/11 |
| 5,569,330 A | * | 10/1996 | Schild et al. ................... 134/1 |
| 5,571,337 A | | 11/1996 | Mohindra et al. ......... 134/25.4 |
| 5,940,985 A | * | 8/1999 | Kamikawa et al. ........... 34/471 |

FOREIGN PATENT DOCUMENTS

| | | | | |
|---|---|---|---|---|
| EP | 0 385 536 | 9/1994 | | |
| JP | 2-156531 | 6/1990 | | |
| JP | 3-169013 | 7/1991 | | |
| JP | 4-80924 | 3/1992 | | |
| JP | 4-251930 | 9/1992 | | |
| JP | 5-243205 | * 9/1993 | ......... | H01L/21/304 |
| JP | 6-77203 | 3/1994 | | |
| JP | 6-283496 | 10/1994 | | |
| JP | 6-283497 | 10/1994 | | |
| JP | 6-326073 | 11/1994 | | |
| JP | 7-130699 | 5/1995 | | |
| JP | 2544971 | * 7/1996 | ......... | H01L/21/304 |
| JP | 175134/1997 | 10/2000 | | |

* cited by examiner

*Primary Examiner*—Randy Gulakowski
*Assistant Examiner*—Shamim Ahmed
(74) *Attorney, Agent, or Firm*—Morrison & Foerster LLP

(57) ABSTRACT

A cleaning and drying apparatus includes a cleaning bath 22 for collecting cleaning liquid and also discharging the liquid, a drying chamber 23 arranged above the cleaning bath 22 and a wafer boat 24 for conveying semiconductor wafers W between the cleaning bath 22 and the drying chamber 23. Dry gas nozzles 37 for ejecting dry gas are provided in the drying chamber 23. A shutter 36 is arranged between the cleaning bath 22 and the drying chamber 23, for insulating the cleaning bath 22 from the drying chamber 23. A central processing unit 60 controls respective operations of the dry gas nozzles 37 and a driving unit 52 for the shutter 36. With the arrangement, after the wafers W have been cleaned in the cleaning bath 22, the cleaning liquid is discharged through a bottom of the bath 22, while the dry gas is supplied from the dry gas nozzles 37 to contact with surfaces of the wafers W and the cleaning liquid in a first drying process. Next, a second drying process is carried out due to condensation of the cleaning liquid on the wafers and the dry gas. In this way, the improvement in drying efficiency and the reduction of consumed dry gas can be accomplished.

13 Claims, 10 Drawing Sheets

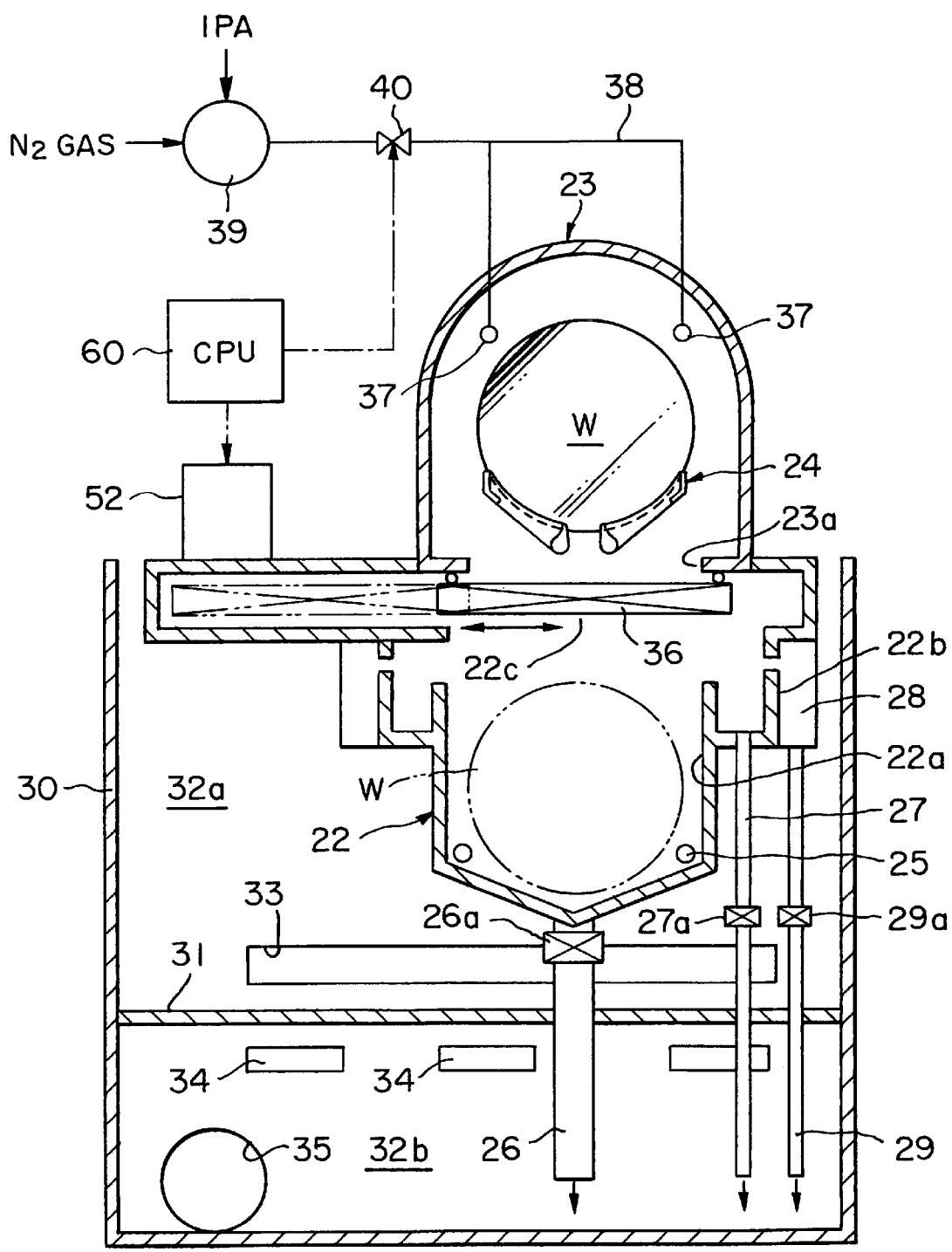
F I G. 3

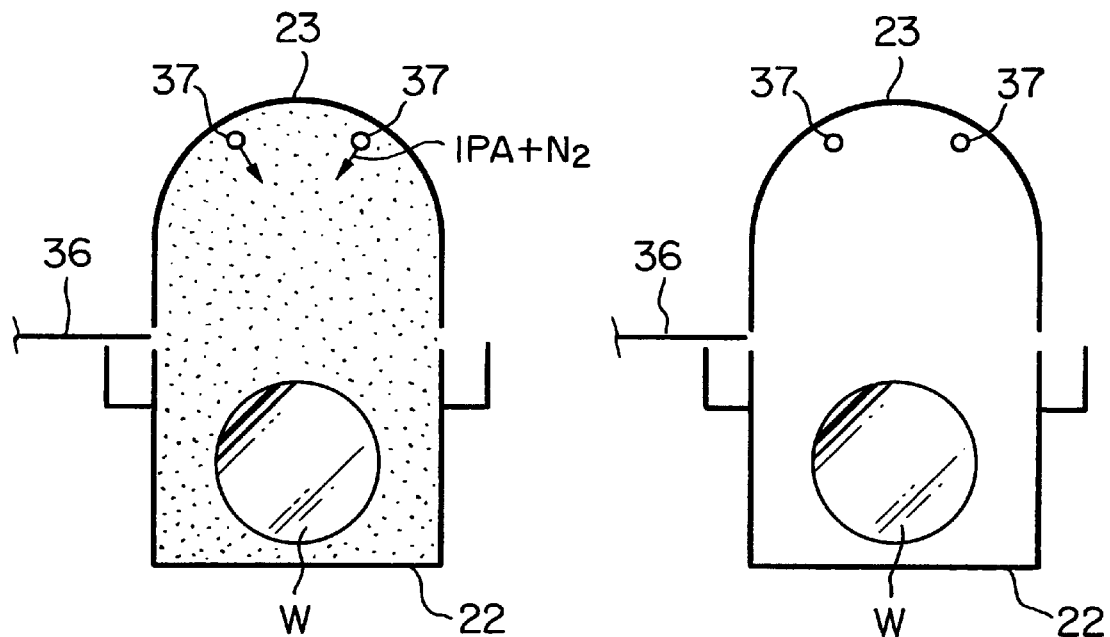
F I G. 7A        F I G. 7B
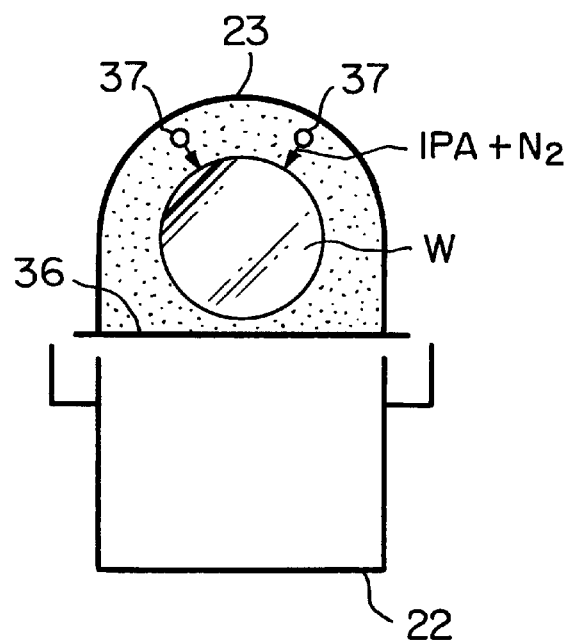
F I G. 8

CLEANING AND DRYING METHOD AND APPARATUS FOR OBJECTS TO BE PROCESSED

BACKGROUND OF THE INVENTION

1. Field of the Invention

The present invention relates to a cleaning and drying method of and an apparatus for cleaning objects to be processed, such as semiconductor wafers and LCD (liquid crystal display) glass substrates etc., by immersing them in cleaning liquid, for example chemicals and rinsing liquid, and sequentially drying the objects cleaned.

2. Description of the Related Art

Generally, in the field for producing semiconductor devices, there is a widely adopted cleaning method where the objects to be processed, such as semiconductor wafers and LCD glass substrates etc.(referred to "wafers etc." hereinafter), are successively immersed in a process bath filled up with the chemicals, the rinsing liquid or the like. In addition, a cleaning apparatus carrying out the above-mentioned method is equipped with a drying apparatus which dehydrates and dries the wafers etc. by contacting the surfaces of the wafers etc. after cleaning with dry gas of vapor of volatile organic solvent such as IPA (isopropyl alcohol) etc., for condensation or absorption of the vapor of the dry gas on the surfaces.

The conventional cleaning and drying methods of this kind are disclosed in Japanese Unexamined Patent Publication (kokai) No. 2-291128 and Japanese Examined Patent Publication (kokoku) No. 6-103686.

In accordance with the art disclosed in the former Publication No. 2-291128, the objects to be processed, for example the wafers are immersed and cleaned in the process bath where the cleaning liquid, e.g. pure water is overflowing. Thereafter, the cleaned wafers are slowly drawn up from the process bath by conveying means such as a chuck and simultaneously, the dry gas composed of vapor of volatile organic solvent, such as IPA (isopropyl alcohol) is supplied into the processing chamber to come in contact with the surfaces of the wafers and the cleaning liquid. That is, the elimination of moisture on the wafers and the drying of the wafers are executed due to the Marangoni effect.

While, according to the art disclosed in the letter Publication No. 6-103686, after cleaning the wafers in the processing chamber filled with the cleaning liquid, for example the pure water, the elimination of moisture on the wafers and the sequent drying are carried out by dry steam of cleaning fluid. In detail, the dry steam is supplied so as to directly remove the pure water from the surfaces of the wafers at such slow replacing speed that the pure water or the dry steam is not substantially removed by evaporation of drops.

In the prior art cleaning and drying methods mentioned above, however, it is necessary to lengthen the contact time of the pure water, the wafers etc. with the dry gas because both of the methods are together directed to completely eliminate the moisture on the wafers by causing the dry gas to contact with the surfaces of the wafers and the cleaning liquid in view of the Marangoni effect and the direct replacing. Therefore, in these conventional methods, there is a drawback of requiring a lot of time for the drying process, thereby causing the drying efficiency to be deteriorated and the great consumption of dry gas. In addition, the long-sustained contact of the wafers with the organic solvent gas, such as IPA, would cause resist films on the wafers to be dissolved into the organic solvent disadvantageously.

SUMMARY OF THE INVENTION

Accordingly, it is therefore an object of the present invention to provide a cleaning and drying method and a cleaning and drying apparatus, by which an improvement in the drying efficiency and a reduction in the dry-gas consumption can be accomplished.

According to the first feature of the present invention, there is provided a cleaning and drying method of drying an object to be processed, which has been immersed in cleaning liquid stored in a cleaning chamber for cleaning said object, in a drying chamber arranged above said cleaning chamber, said method including steps of:

supplying dry gas into said cleaning chamber after cleaning said object;

draining said cleaning liquid under condition that said object is fixed in said cleaning chamber, while contacting said dry gas with said object to dry said object in a first drying process; and moving said object to said drying chamber after the first drying process and sequentially supplying dry gas into said drying chamber to dry said object in a second drying process. In the above-mentioned method, both said dry gas used in the first drying process and said dry gas used in the second drying process may contain volatile organic solvent. Alternatively, said dry gas used in the first drying process may contain volatile organic solvent, while said dry gas used in the second drying process may be inert gas. Further, said moving step of moving said object to said drying chamber can be carried out after said cleaning liquid has been drained or a level of said cleaning liquid has been lowered below said object to be processed.

According to the above-mentioned method, by moving the object into the drying chamber after the first drying process to contact the dry gas with the object and subsequently contacting the dry gas with the object again, it is possible to prevent much moisture from adhering to the object moved into the drying chamber and dry the object by its contact with very little dry gas supplied into the drying chamber. Therefore, owing to the adoption of the first and second drying processes, it is possible to effectively make use of a small amount of dry gas without using a great amount of dry gas at a time, whereby the reduction in consumption of dry gas and the improvement in drying efficiency can be accomplished.

According to the second feature of the present invention, in the cleaning and drying method of the first feature, closing means for insulating said cleaning chamber and said drying chamber from each other is arranged between said cleaning chamber and said drying chamber and said closing means is closed during drying said object in the second drying process.

Thus, the second drying process can be executed under condition that the closing means is closed, whereby it is possible to reduce the consumption of dry gas furthermore. Additionally, the provision of the closing means allows the cleaning liquid in the cleaning chamber to be exchanged for new liquid during the second drying process in the drying chamber, so that the cleaning process for the next object can be carried out as soon as the second drying process has finished.

According to the third feature of the invention, alternatively, the above closing means may be closed during drying said object in the first drying process. Also in this case, it is possible to reduce the consumption of dry gas required for the first drying process, furthermore.

According to the fourth feature of the invention, alternatively, the above closing means may be closed except that said object is being moved between said cleaning chamber and said drying chamber.

Also in this case, since the first drying process can be executed while closing the closing means, it is possible to further reduce the consumption of dry gas required for the first drying process, similarly.

According to the fifth feature of the invention, the cleaning and drying method of the first feature is characterized by a further step of blowing dry gas against said object during moving said object from said cleaning chamber to said drying chamber. Thus, owing to the increased time of the object's contact with the dry gas, it is possible to improve the drying efficiency.

According to the sixth feature of the invention, the cleaning and drying method of the first feature is further characterized in that said dry gas is supplied into said drying chamber to create an atmosphere of dry gas during executing the first drying process, previously to the second drying process. Thus, since the object transported into the drying chamber is in the atmosphere of the dry gas, it is possible to shorten the second drying period and reduce the consumption of the dry gas.

According to the seventh feature of the invention, there is also provided a cleaning and drying apparatus for cleaning and drying an object to be processed, said apparatus including:

- a cleaning chamber storing cleaning liquid, said cleaning chamber being constructed so as to drain said cleaning liquid through a lower portion of said cleaning chamber;
- a drying chamber positioned above said cleaning chamber;
- moving means for moving said object between said cleaning chamber and said drying chamber;
- at least one dry-gas nozzle arranged in said drying chamber;
- closing means arranged between said cleaning chamber and said drying chamber, for allowing said cleaning chamber and said drying chamber to be insulated from each other; and
- control means for controlling operations of said dry-gas nozzle and said closing means. With the above-mentioned arrangement, the dry gas can be effectively utilized thereby to down-size the apparatus.

According to the eighth feature of the invention, there is also provided a cleaning and drying apparatus for cleaning and drying an object to be processed, said apparatus including:

- a cleaning chamber storing cleaning liquid, said cleaning chamber being constructed so as to drain said cleaning liquid through a lower portion of said cleaning chamber;
- a drying chamber positioned above said cleaning chamber;
- moving means for moving said object between said cleaning chamber and said drying chamber;
- at least one first dry-gas nozzle arranged in said drying chamber;
- closing means arranged between said cleaning chamber and said drying chamber, for allowing said cleaning chamber and said drying chamber to be insulated from each other; and
- at least one second dry-gas nozzle arranged in said cleaning chamber.

With the above-mentioned arrangement, the dry gas can be utilized effectively, so that it is possible to improve the drying efficiency and additionally, the efficiency in the cleaning and drying processes can be improved. Further, since the above arrangement allows the drying chamber to be down-sized in capacity, thereby miniaturizing the apparatus itself.

According to the ninth feature of the invention, the above-mentioned cleaning and drying apparatus of the eighth feature is characterized by further control means for controlling operations of said first and second dry-gas nozzles and said closing means. Thus, the dry gas can be utilized effectively, so that it is possible to improve the drying efficiency and additionally, the efficiency in the cleaning and drying processes can be improved.

The above and other features and advantages of this invention will become apparent, and the invention itself will best be understood from a study of the following description and appended claims, with reference to the attached drawings showing preferred embodiments of the invention.

BRIEF DESCRIPTION OF THE DRAWINGS

FIG. 3 is a cross sectional view of the cleaning and drying apparatus in accordance with a first embodiment of the invention;

FIGS. 7A and 7B are schematic cross sectional views showing two conditions after the first drying condition of the cleaning and drying apparatus of the first embodiment;

FIG. 8 is a schematic cross sectional view showing the second drying condition of the cleaning and drying apparatus of the first embodiment;

DESCRIPTION OF THE PREFERRED EMBODIMENT

Embodiments of the present invention will be described with reference to drawings. Note, in the embodiments described below, the present invention is applied to a cleaning system for semiconductor wafers.

Figure 1:
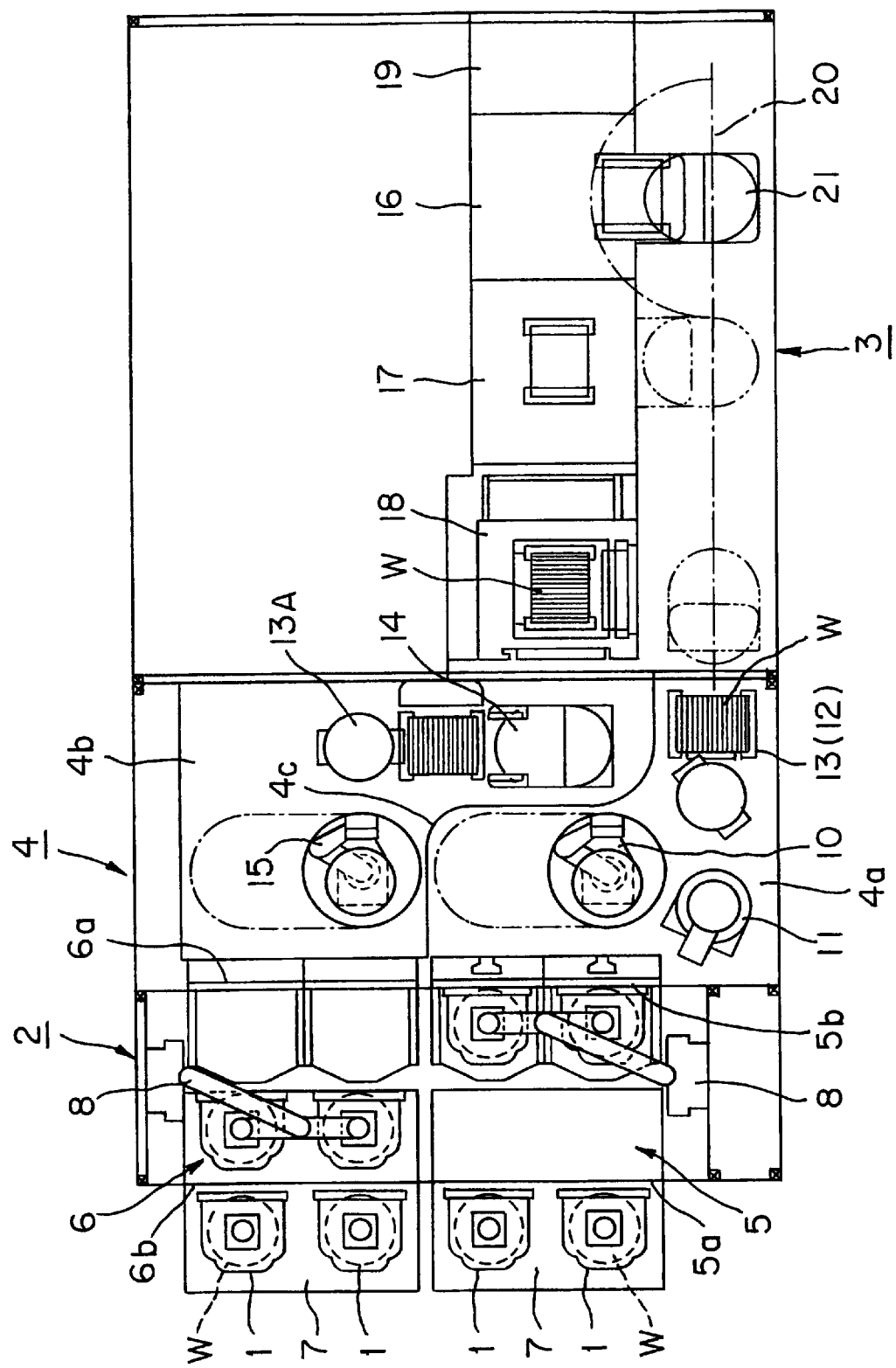
FIG. 1 is a schematic plan view of a cleaning and drying system to which a cleaning and drying apparatus in accordance with the present invention is applied.
Figure 2:
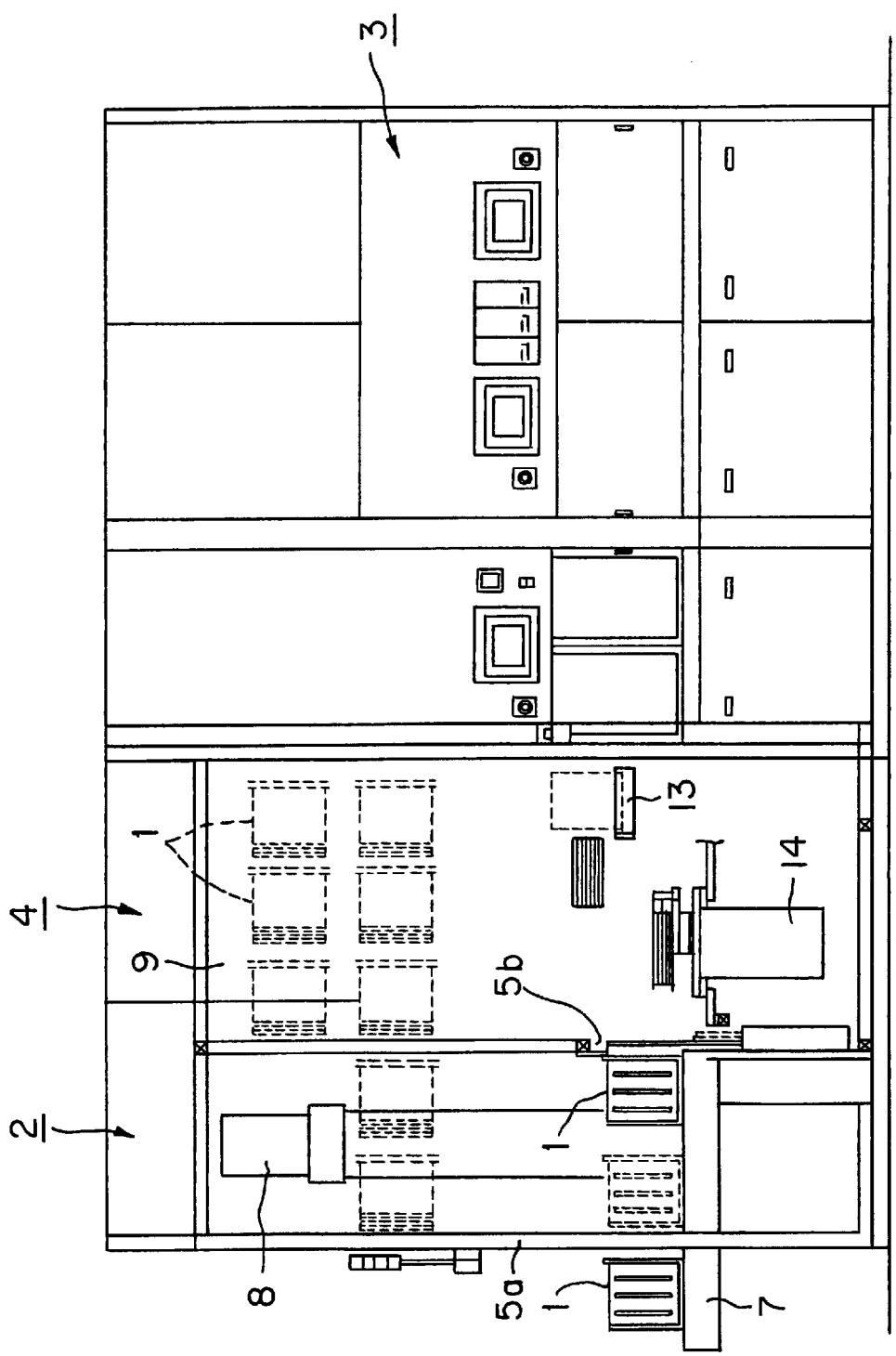
FIG. 2 is a schematic side view of the cleaning and drying system of FIG. 1.

FIG. 1 is a schematic plan view showing an example of the cleaning system to which the cleaning and drying apparatus of the present invention is applied and FIG. 2 is a schematic side view of the system. Essentially, the cleaning system includes a conveying section 2 for conveying a plurality of containers, for example carriers 1 for horizontally accommodating semiconductor wafers W (objects to be processed), a processing section 3 for cleaning the wafers W by chemicals, cleaning liquid etc. and sequentially drying the wafers W and an interface section 4 for delivering the wafers W between the conveying section 2 and the processing section 3 with the positional adjustment, posture change etc. for the wafers W.

The conveying section 2 includes an input (carry-in) part 5 and an output (carry-out) part 6, both of which are juxtaposed to each other on one side of the cleaning system. Provided in an input port 5a of the input part 5 and an output port 6a of the output part 6 are slide tables 7 which loads the carriers 1 into the parts 5 and 6 and also unloads them out of the parts 5 and 6. Carrier lifters 8 are arranged in the input and output parts 5 and 6, respectively. Owing to the provision of the carrier lifters 8, the carriers 1 can be conveyed between the input parts or between the output parts. Further, the vacant carriers 1 can be delivered to and from a carrier stand-by part 9 arranged above the conveying section 2 (see FIG. 2).

The interface section 4 is divided to a first chamber 4a and a second chamber 4b adjoined to the input part 5 and the output part 6 through a partition wall 4c, respectively.

In the first chamber 4a, a wafer pick-up arm 10, a notch aligner 11 and a first posture changing device 13 are provided. In operation, the wafer pick-up arm 10 picks a plurality of wafers W out of the carriers 1 and transports them. For this, the wafer pick-up arm 10 is constructed so as to move in the horizontal directions (X, Y) and the vertical direction (Z) and also rotate in the direction (θ). The notch aligner 11 detects notches formed on the wafers W. The first posture changing device 13 changes the horizontal arrangement of the wafers W to the vertical arrangement, also including a clearance adjusting mechanism 12 for adjusting clearances among the plural wafers W picked up by the wafer pick-up arm 10.

In the second chamber 4b, a wafer delivery arm 14, a second posture changing device 13A and a wafer accommodating arm 15 are provided. In operation, the wafer delivery arm 14 receives the processed and vertically arranged wafers W from the processing section 3 and conveys them in succession. The second posture changing device 13A changes the vertical arrangement of the wafers W delivered from the arm 14 to the horizontal arrangement. The wafer accommodating arm 15 receives the plural wafers W in the horizontal arrangement and accommodates them in the empty carriers 1 brought into the output part 6. Similarly to the wafer pick-up arm 10, the wafer accommodating arm 15 is movable in the horizontal directions (X, Y), the vertical direction (Z) and rotatable in the direction (θ). Note, the second chamber 4b is constructed so as to be sealable to the outside and replaceable by inert gas, for example nitrogen ($N_2$) gas which may be supplied from a not-shown gas source of ($N_2$) gas.

In the processing section 3, a first processing unit 16 for eliminating particles and organic contaminants adhering to the wafers W, a second processing unit 17 for eliminating metallic contaminants adhering to the wafers W, a cleaning and drying apparatus 18 of the invention as a cleaning and drying unit for eliminating chemical oxidation layers on the wafers W and sequentially drying them, and a chuck-cleaning unit 19 are arranged in series. Arranged in a conveyer path 20 opposing the respective units 16–19 is a wafer conveyer arm 21 which is movable in the X, Y directions (horizontal directions) and the Z direction (vertical direction) and rotatable in the θ direction.

Next, we describe the cleaning and drying apparatus of the present invention.

1st. Embodiment

Figure 4:
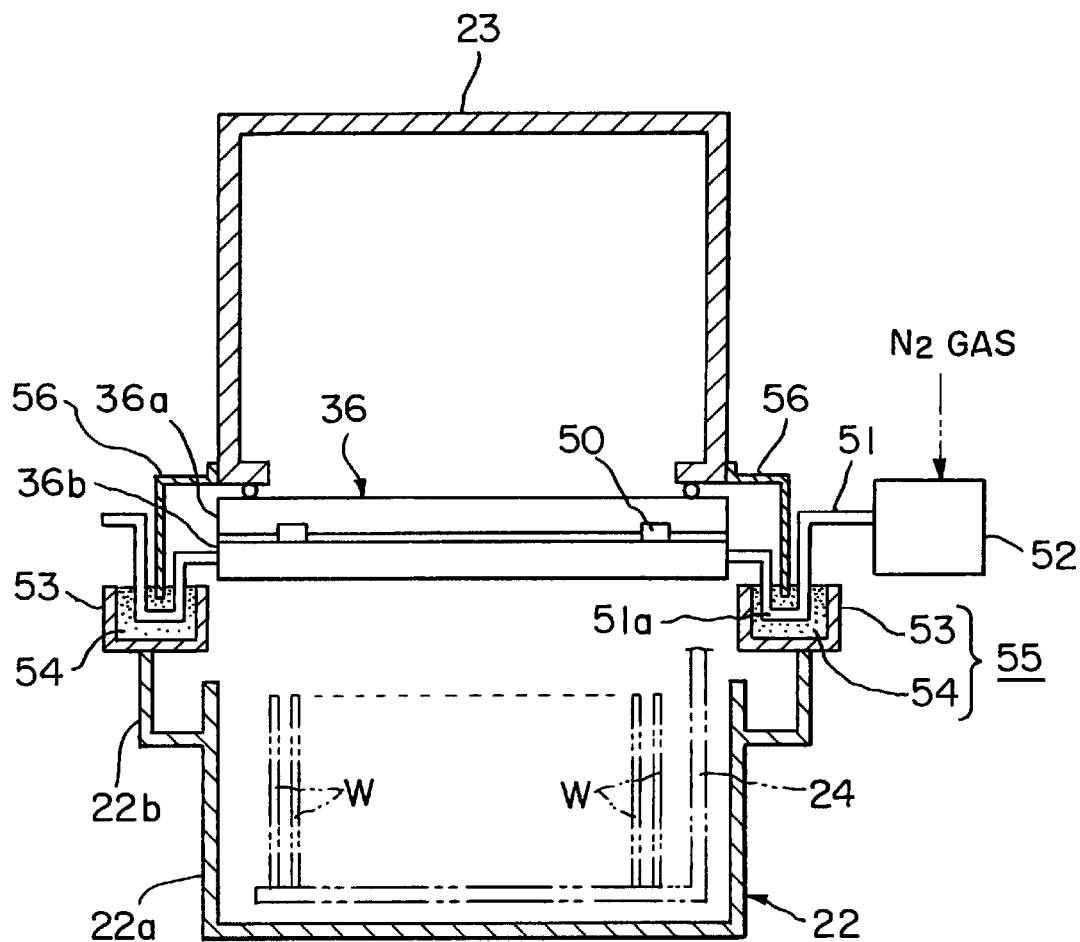
FIG. 4 is a lateral cross sectional view of the cleaning and drying apparatus of FIG. 3, showing an essential part of the apparatus.

FIG. 3 is a cross sectional view of the cleaning and drying apparatus in accordance with the first embodiment of the invention and FIG. 4 is a lateral cross sectional view of an essential part of the cleaning and drying apparatus.

The cleaning and drying apparatus 18 essentially includes a cleaning bath 22 which may be called to "a cleaning chamber", a drying chamber 23 and carrier means for carrying the plural wafers. In the cleaning bath 22, cleaning liquid, such as chemicals (e.g. fluorohydroacid), pure wafer etc., is accommodated to immerse the wafers W. While, the drying chamber 23 is arranged above the cleaning bath 22. The carrier means, for example a wafer boat 24 operates to carrying the plural wafers W (e.g. fifty wafers) and move the wafers W into the cleaning bath 22 and the drying chamber 23

The cleaning bath 22 is composed of an inner bath 22a and an outer bath 22b made of e.g. silica members or polypropylene material. Outside an upper end of the inner bath 22a, the outer bath 22b is provided to receive the cleaning liquid overflowing the inner bath 22a. The inner bath 22a is provided, on both sides of a lower part thereof, with cleaning liquid nozzles 25 which eject the cleaning liquid to the wafers W in the cleaning bath 22. By supplying the chemicals or pure water from a not-shown liquid source connected to the cleaning liquid nozzles 25 through control valves, the cleaning bath 22 is adapted so as to store the chemical or the pure water. Additionally, the inner bath 22a has a drain port formed at the bottom and connected to a drain pipe 26 interposing a drain valve 26a. Similarly, another drain pipe 27 interposing a drain valve 27a is connected with a drain port at the bottom of the outer bath 22b. Note, outside the outer bath 22b, an exhaust box 28 is provided with an exhaust port connected to an exhaust pipe 29 through a valve 29a.

The above-constructed cleaning bath 22 and the exhaust box 28 are disposed in a cylindrical box 30 with a bottom. Owing to the provision of a horizontal partition 31, the box 30 is divided into an upper chamber 32a on the side of the cleaning bath 22 and a lower chamber 32b on the respective sides of the drain port of the drain pipe 26 connected to the inner bath 22a, the drain port of the drain pipe 27 connected to the outer bath 22b and the exhaust port of the exhaust pipe 29. With this separation, it is possible to prevent an atmosphere in the lower chamber 32b and splashes of waste liquid from entering the upper chamber 32a, whereby the cleanness of the upper chamber 32a can be maintained. An exhaust window 33 is formed in a sidewall of the upper chamber 32a, exhaust windows 34 on an upper portion of the sidewall of the lower chamber 32b, and a drain port 35 is formed on a lower portion of the sidewall of the lower chamber 32b.

The drying chamber 23 is in the form of a silica member having a reverse U-shaped cross section with an opening 23a communicating with an opening 22c of the cleaning bath 22 through a shutter 36. Inside the drying chamber 23, dry gas nozzles 37 are disposed on both sides of an upper portion of the chamber 23. The dry gas nozzles 37 are connected with a dry gas generator 39 through a supply pipe 38 forking to the nozzles 37. A not-shown liquid source (e.g. IPA) for the dry gas and a not-shown source of carrier gas (e.g. $N_2$) are connected to the dry-gas generator 39. Further, a control valve 40 is interposed in the supply pipe 38. Depending on opening or closing operation of the control valve 40, it is possible to control the supply of dry gas (IPA+$N_2$) produced in the dry-gas generator 39 into the drying chamber 23 through the dry-gas nozzles 37. In connection, by stopping to supply the liquid IPA to the generator 39, it is also possible to introduce the only $N_2$ gas to the drying chamber 23 through the dry-gas supply nozzles 37. Such opening and closing a operations of the control valve 40 are controlled by signals generated from control means, for example a center processing unit (CPU) 60. As to the dry gas for use, the organic solvent in the alcohol ketone family such as IPA, the ether family, the multivalent alcohol family and the like are usable for the dry gas. As shown in FIG. 4, the shutter 36 is divided into an upper shutter body 36a and a lower shutter body 36b. The shutter 36 is also adapted so as to adjust a distance between the upper shutter body 36a and the lower shutter body 36b by actuating a plurality of cylinders 50 (e.g. eight cylinders) interposed therebetween. The so-constructed shutter 36 allows the respective shutter bodies 36b, 36a to establish contact with the cleaning bath 22 and the drying chamber 23 while the shutter 36 is being closed. Therefore, it is possible to ensure the insulation of the cleaning bath 22 and the drying chamber 23 from each other. On both sides of the lower shutter body 36b, a pair of airfoil pieces 51 of reverse hat-shaped cross sections is formed so as to project along the opening and closing directions of the shutter 36. One of the airfoil pieces 51 is connected with opening and closing driving means 52 for the shutter 36, which will be referred as "driving means", hereinafter. In this case, the driving means 52 includes, for example a ball screw mechanism. The ball screw mechanism is accommodated in a casing into which the inert gas, e.g. $N_2$ gas is supplied. Both of the airfoil pieces 51 are constructed so as to move on condition that respective bent portions 51a of the pieces 51 are being immersed in sealing liquid 54 (e.g. water) stored in tub-shaped baths 53 mounted on the cleaning bath 22.

In this way, a liquid sealing mechanism 55 of the invention includes the tub-shaped baths 53 movably accommodating the bent portions 51a of the airfoil pieces 51 projecting from both sides of the shutter 36 and the sealing liquid 54 stored in the baths 53 to immerse the bent portions 51a of the airfoil piece 51. Owing to the liquid sealing mechanism 55 constructed above, it is possible to seal the cleaning bath 22 from the outside in the airtight and watertight manner (in detail, on the side of the driving means 52 of the shutter 36 and the opposite side of the driving means 52 over the cleaning bath 22). Note, not shown though it is, the sealing liquid 54 is always supplied from a supply port formed in the bottom of each bath 53, while the liquid 54 is discharged from a drain port formed on an upper lateral portion of the bath 53 for always filling the bath 53 with the sealing liquid 54. The cleaning bath 22 is separated from the moving means 52 by the partition 56 on one side and furthermore, the lower end of each partition 56 is immersed in the sealing liquid 54 at the interior of the bent portion 51a of the airfoil piece 51 in the tub-shaped bath 53. With the arrangement, it is possible to insulate the processing area in the cleaning bath 22 from the atmosphere on the side of the moving means 54 certainly.

In connection, the driving means 52 and the cylinders 50 are adapted so as to open and close the shutter 36 on the basis of signals outputted from the control means, i.e. the CPU 60.

We now describe an operation of the above cleaning and drying apparatus of the first embodiment, with reference to FIGS. 5 to 8.

① Cleaning Process

Figure 5A:
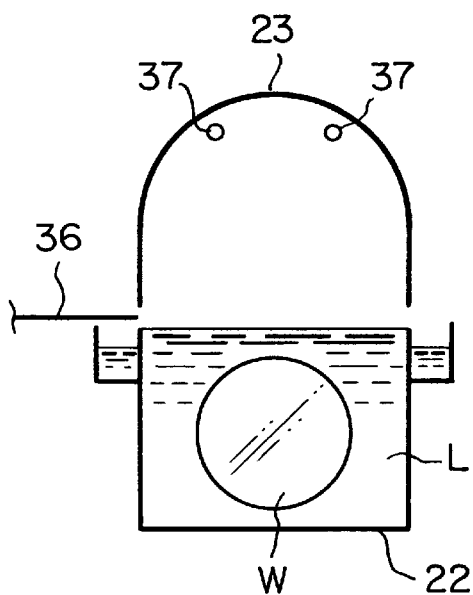
FIGS. 5A and 5B are schematic cross sectional views showing two cleaning conditions of the cleaning and drying apparatus of the first embodiment.
Figure 5B:
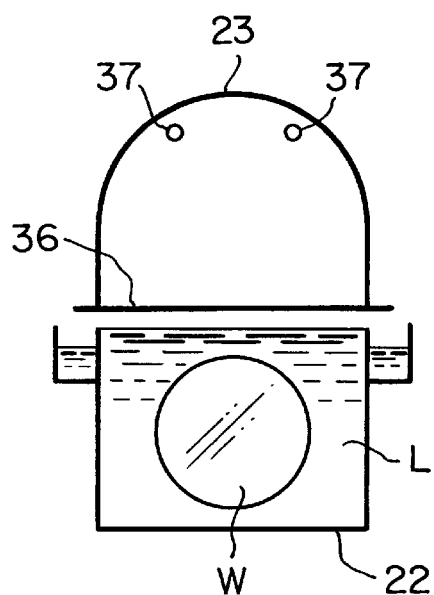

As shown in FIG. 5A, on condition that the wafers W are accommodated in the cleaning bath 22 while opening the shutter 36, the chemical or the cleaning liquid, for example the pure water L is stored to overflow the bath 22 for the cleaning process. Alternatively, as shown in FIG. 5B, on condition that the wafers W are accommodated in the cleaning bath 22 while closing the shutter 36, the chemical or the cleaning liquid, for example the pure water L is stored to overflow the bath 22 for the cleaning process. When it is required to carry out the chemical treatment and the cleaning process in succession, the cleaning liquid may be supplied from the nozzles when the chemical has been drained after the chemical treatment. Or again, after the chemical treatment has been completed, the chemical may be replaced with the cleaning liquid.

② First Drying

Figure 6:
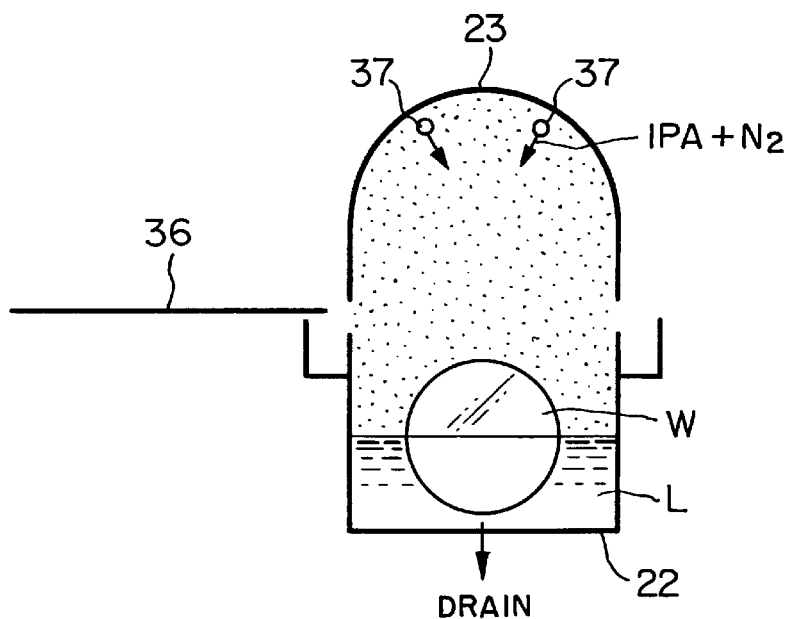
FIG. 6 is a schematic cross sectional view showing the first drying condition of the cleaning and drying apparatus of the first embodiment.

After the completion of the cleaning process, as shown in FIG. 6, the pure water L in the cleaning bath 22 is drained through the lower part of the bath 22. Simultaneously, the dry gas (IPA+$N_2$) is supplied into the drying chamber 23 through the dry-gas nozzles 37. Thus, the dry gas is brought into contact with the surfaces of the wafers W and the pure water L, so that the moisture on the wafers W is eliminated due to the Marangoni effect in the first drying process (rough dry). That is, in the first drying of the embodiment, it has only to eliminate the moisture so that it is visible to the naked eye because the purpose of first drying does not reside in its complete removal of moisture. Therefore, since the perfect elimination of moisture is not required in this drying process, there is no need to supply a large amount of the dry gas.

After the first drying, as shown in FIG. 7A, the supply of the dry gas from the dry gas nozzles 37 is continued. Alternatively, the supply of the dry gas from the dry gas nozzles 37 may be stopped as shown in FIG. 7B.

③ Second Drying

After the completion of the first drying process, a not-shown wafer boat is elevated to transport the wafers W into the drying chamber 23 and thereafter, as shown in FIG. 8, the dry gas is supplied from the dry gas nozzles 37 upon closing the shutter 36, so that the elimination of moisture and the secondary drying are completed by condensing the dry gas and the pure wafer L remaining on the surfaces of the wafers W. In the second drying, as some amount of moisture has been already eliminated in the preceding first drying, it is possible to reduce the supply of dry gas and shorten a time required to dry the wafers W. Accordingly, the efficiency of drying can be improved while reducing the consumption of the dry gas. In addition, by exchanging the cleaning liquid in the cleaning bath 22 during the second drying process, it is possible to advance the beginning of the subsequent cleaning process. After the second drying, $N_2$gas is supplied into the drying chamber 23 through the dry gas nozzles 37 to complete the drying process.

Note, regarding the dry gas in both cases shown in FIGS. 7A and 8, it can be the mixed gas of IPA and $N_2$ if the drying of the wafers is insufficient. On the contrary, if the drying of the wafers is sufficient, only $N_2$ gas may be used for the dry gas.

2nd. Embodiment

Figure 9:
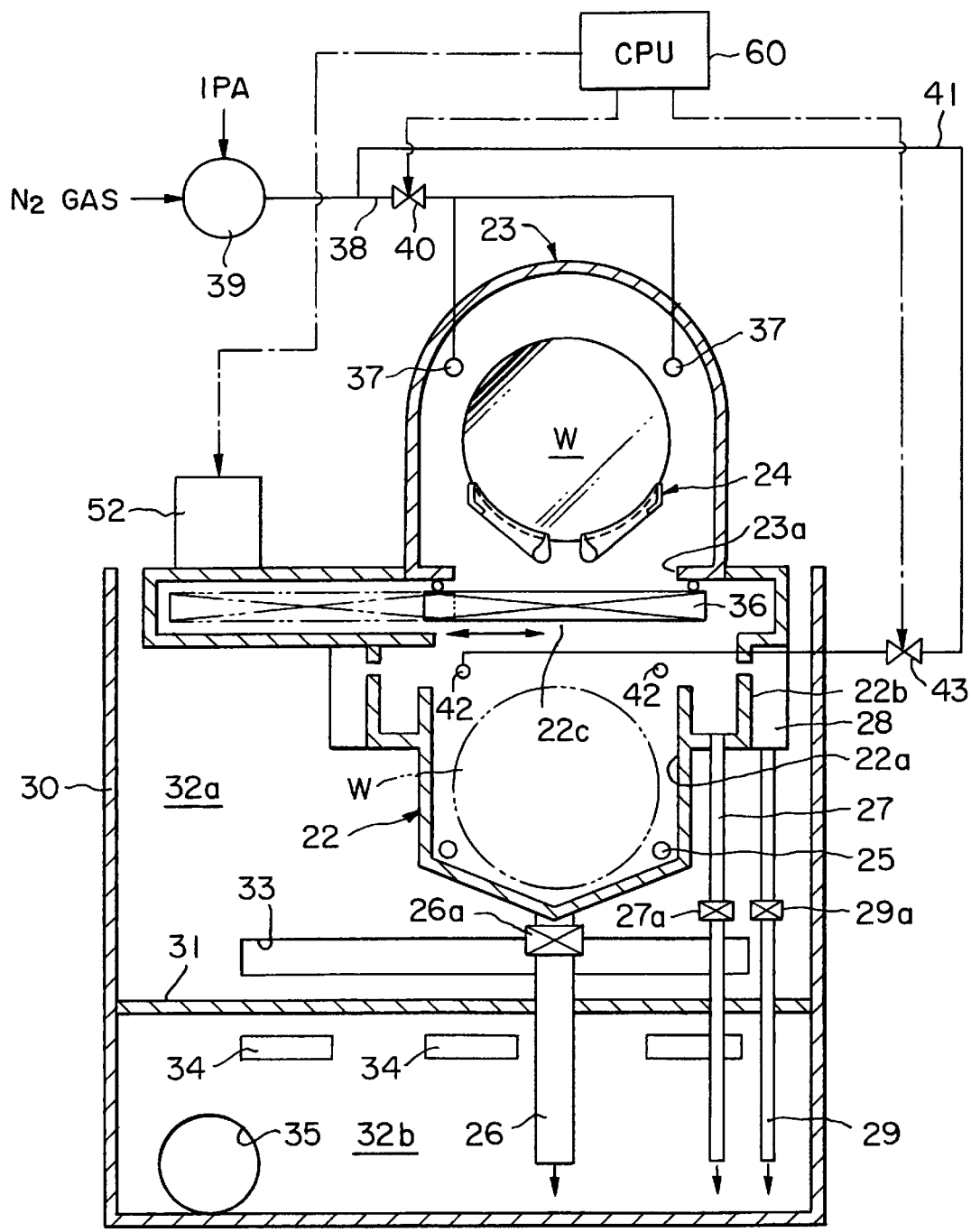
FIG. 9 is a cross sectional view of the cleaning and drying apparatus in accordance with a second embodiment of the invention.

FIG. 9 is a cross sectional view of the cleaning and drying apparatus in accordance with the second embodiment of the invention. The second embodiment is directed to a further improvement of the drying efficiency of the apparatus. For this purpose, second dry gas nozzles 42 are arranged on the inward side of the opening 22c of the cleaning bath 22. Consequently, the dry gas is supplied into the cleaning bath 22 through a different supply system from the above-mentioned dry gas nozzles 37 of the first embodiment. Note, in the second embodiment, the dry gas nozzle 37 are referred as "the first dry gas nozzles", hereinafter. The second dry gas nozzles 42 are connected to the dry gas generator 39 through a branch pipe 41 diverged from the supply pipe 38 connected to the first dry gas nozzles 37. A control valve 43 is interposed in the branch pipe 41. Similarly to the above control valve 40, the opening and closing operations of the control valve 43 are controlled on the basis of the signals from the CPU 60.

Note, in the second embodiment, other elements similar to those of the first embodiment are indicated by the same reference numerals respectively, and their descriptions are eliminated. We now describe an operation of the above cleaning and drying apparatus of the second embodiment, with reference to FIGS. 10 to 14.

① Cleaning Process

Figure 10:
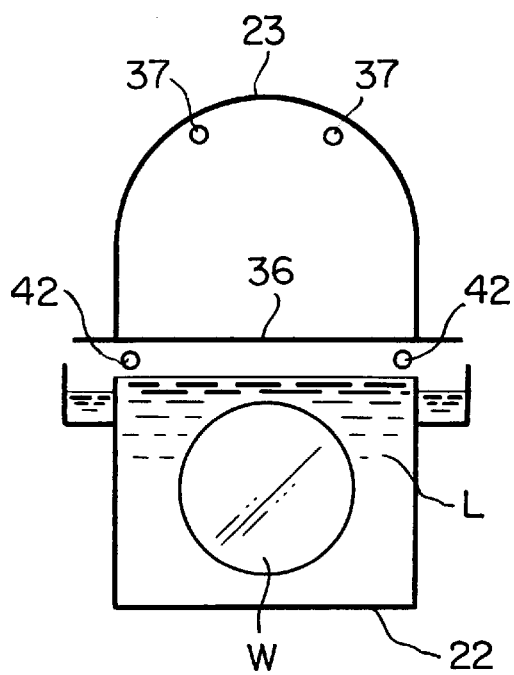
FIG. 10 is a schematic cross sectional views showing a cleaning condition of the cleaning and drying apparatus of the second embodiment.

As shown in FIG. 10, on condition that the wafers W are accommodated in the cleaning bath 22 while closing the shutter 36, the chemical or the cleaning liquid, for example the pure water L is stored to overflow the bath 22 for the cleaning process. Thus, by executing the cleaning process under closing condition of the shutter 36, it is possible to prevent the atmosphere in the cleaning bath 22 from dispersing into the drying chamber 23. Therefore, it is possible to avoid the inner wall of the upper drying chamber from being contaminated by the atmosphere in the cleaning chamber 22, whereby the atmosphere of the drying chamber 23 can be maintained. Such a cleaning form would be especially effective in case of executing the chemical treatment in the cleaning bath 22. When it is required to carry out the chemical treatment and the cleaning process in succession, the cleaning liquid may be supplied from the nozzles when the chemical has been drained after the chemical treatment. Or again, after the chemical treatment has been completed, the chemical may be replaced with the cleaning liquid.

② First Drying

Figure 11:
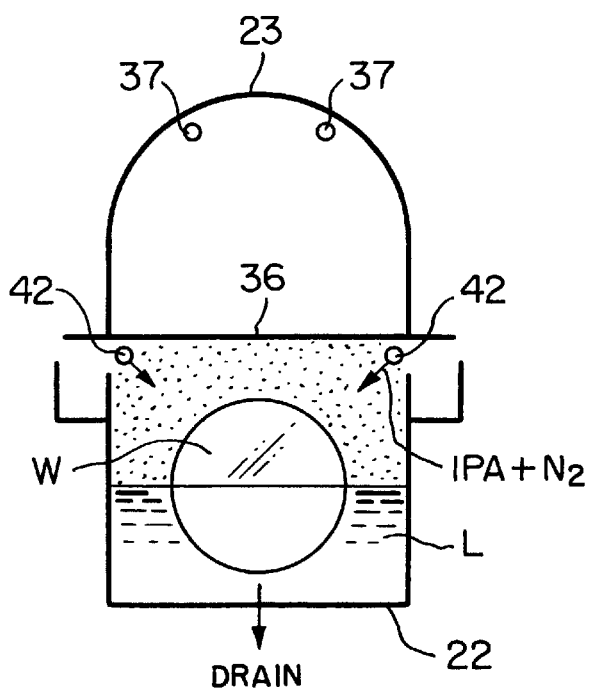
FIG. 11 is a schematic cross sectional view showing the first drying condition of the cleaning and drying apparatus of the second embodiment.

After the completion of the cleaning process, as shown in FIG. 11, the pure water L in the cleaning bath 22 is drained through the lower part of the bath 22. Simultaneously, the dry gas ($IPA+N_2$) is supplied into the cleaning bath 22 through the second dry-gas nozzles 42. Thus, the dry gas is brought into contact with the surfaces of the wafers W and the pure water L, so that the moisture on the wafers W is eliminated due to the Marangoni effect in the first drying process. Note, since the perfect elimination of moisture is not required in this drying process, there is no need to supply a large amount of the dry gas.

Figure 12A:
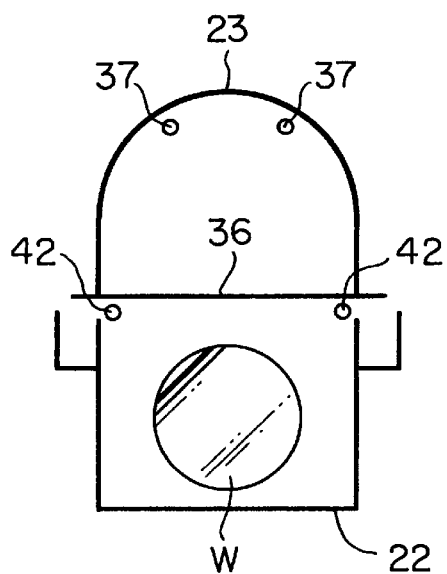
FIGS. 12A, 12B, 12C and 12D are schematic cross sectional views showing four conditions after the first drying of the cleaning and drying apparatus of the second embodiment.
Figure 12B:
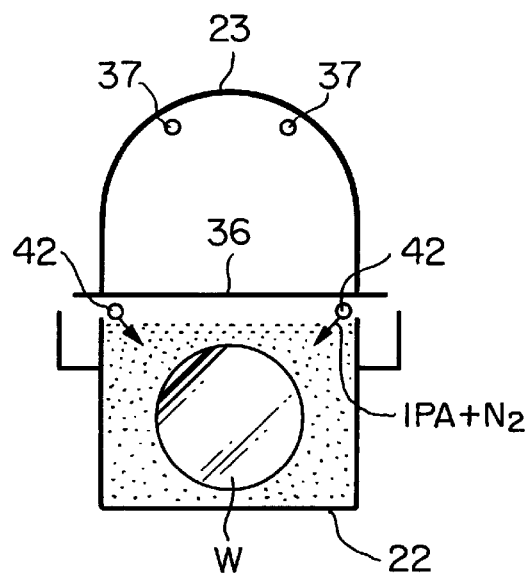
Figure 12C:
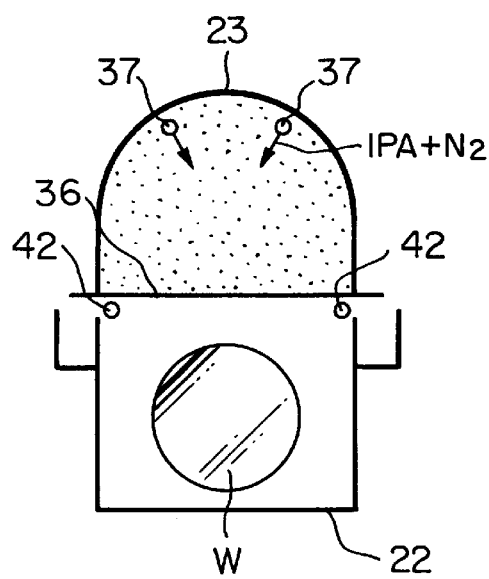
Figure 12D:
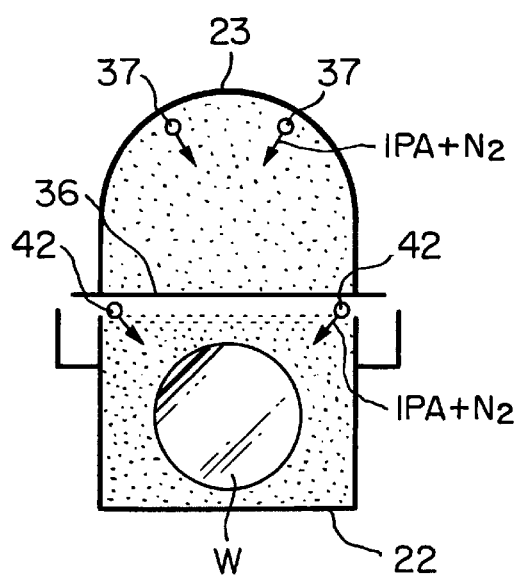

After the first drying, as shown in FIG. 12A, the supply of the dry gas from the second dry gas nozzles 42 is stopped. Alternatively, the supply of the dry gas from the second dry gas nozzles 42 may be continued. as shown in FIG. 12B. Or again, as shown in FIG. 12C, the dry gas is supplied into the drying chamber 23 through the first dry gas nozzles 37 in order to create the chamber 23 with the atmosphere of dry gas, while the supply of dry gas through the second dry gas nozzles 42 is stopped. Alternatively, as shown in FIG. 12D, while supplying the dry gas through the second dry gas nozzles 42, the dry gas is also supplied into the drying chamber 23 through the first dry gas nozzles 37 in order to create the chamber 23 with the atmosphere of dry gas. In the above-mentioned drying forms, the establishment of the drying chamber 23 under the atmosphere of dry gas (shown in FIGS. 12C and 12D) allows the dry gas used in the sequent second drying process to be reduced and a time for drying to be shortened. In this case, the drying chamber 23 may be filled with the atmosphere of dry gas during the first drying process.

③ Moving Wafers into Drying Chamber

Figure 13A:
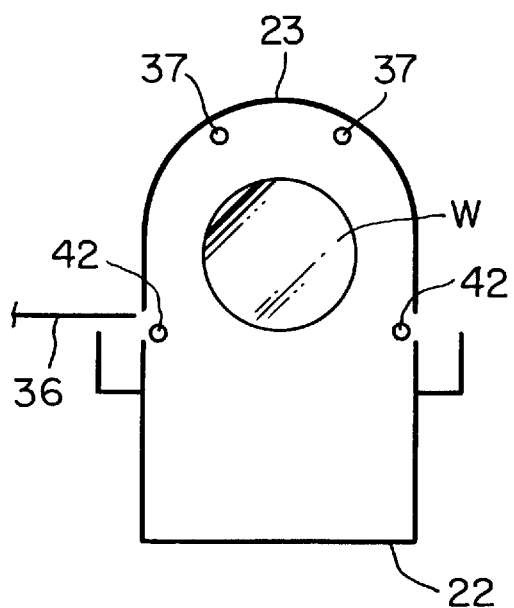
FIGS. 13A, 13B and 13C are schematic cross sectional views showing three moving conditions of the objects to be processed, in the cleaning and drying apparatus of the second embodiment.
Figure 13B:
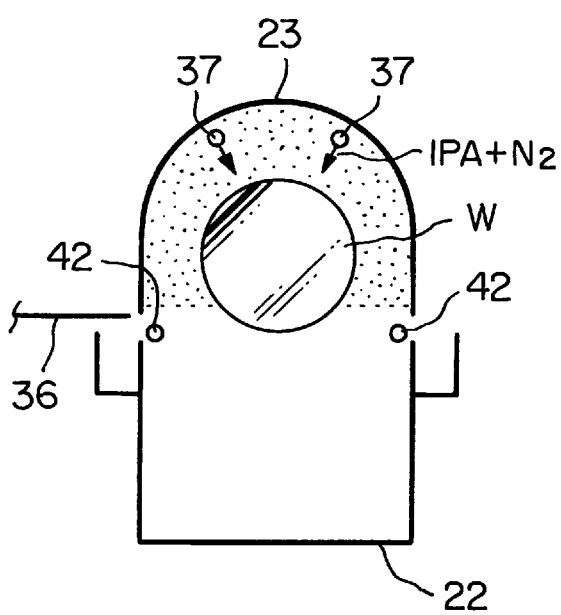
Figure 13C:
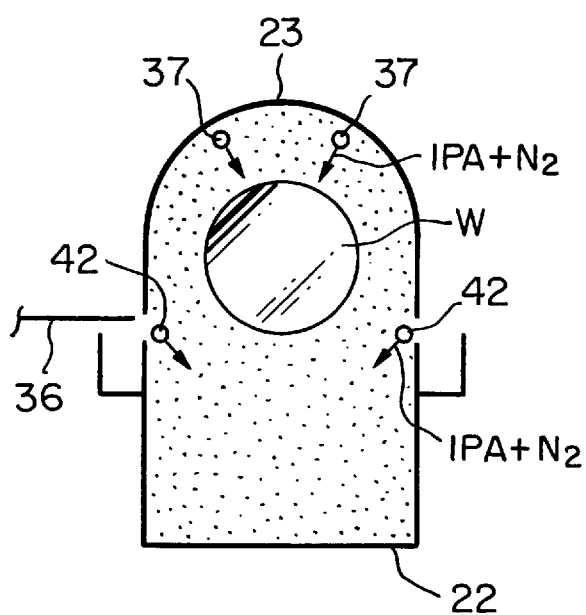

After the completion of the first drying process, a not-shown wafer boat is elevated to transport the wafers W into the drying chamber 23. Simultaneously, as shown in FIG. 13A, the supply of dry gas from the first and second dry gas nozzles 37, 42 is stopped. Alternatively, as shown in FIG. 13B, the dry gas may be supplied from the first dry gas nozzles 37 to dry the moving wafers W. Or again, the dry gas may be supplied from both of the first and second dry gas nozzles 37, 42, as shown in FIG. 13C. Note, the moving of the wafers W may be started when a level of the cleaning liquid to be drained reaches below the wafers W.

④ Second Drying

Figure 14:
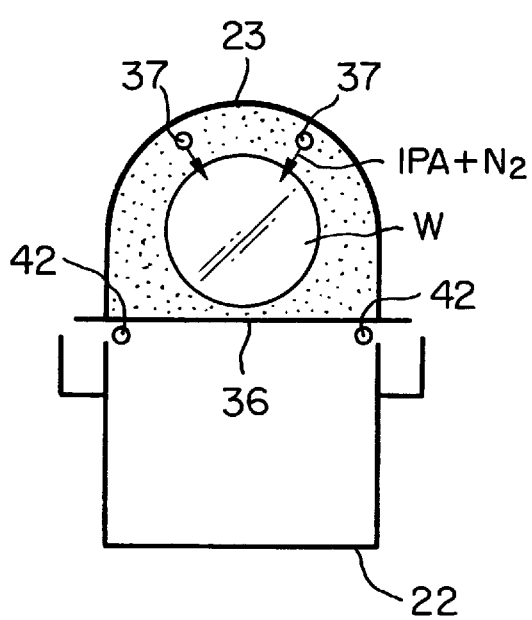
FIG. 14 is a schematic cross sectional view showing the second drying condition of the cleaning and drying apparatus of the second embodiment.

After moving the wafers W into the drying chamber 23, as shown in FIG. 14, the dry gas is supplied from the first dry gas nozzles 37 upon closing the shutter 36, so that the elimination of moisture and the secondary drying are completed by condensing the dry gas and the pure wafer L remaining on the surfaces of the wafers W In the second drying, since excessive moisture has been already removed in the preceding first drying and further removed by the dry gas blown during the wafers' moving, it is possible to reduce the supply of dry gas and shorten a time required to dry the wafers W. Accordingly, the efficiency of drying can be improved while reducing the consumption of the dry gas. Note, by exchanging the cleaning liquid in the cleaning bath 22 during the second drying process, it is possible to advance the beginning of the subsequent cleaning process. After the second drying, $N_2$ gas in place of the dry gas is supplied to complete the drying process.

Note, regarding the dry gas in respective cases shown in FIGS. 12B, 12C, 12D, 13B, 13C and 14, it can be the mixed gas of IPA and $N_2$ if the drying of the wafers is insufficient. On the contrary, if the drying of the wafers is sufficient, only $N_2$ gas may be used for the dry gas.

Although the above embodiments have been described with regard to the application of the cleaning and drying apparatus of the invention on the cleaning system for the semiconductor wafers, it is natural that the cleaning and drying apparatus is applicable to processing systems besides the cleaning process. Further, it is a matter of course that the drying apparatus can be used for the LCD glass substrates besides the semiconductor wafers.

As mentioned above, according to the cleaning and drying apparatus of the present invention, by moving the object into the drying chamber after the first drying process to contact the dry gas with the object and subsequently contacting the dry gas with the object again, it is possible to prevent much moisture from adhering to the object moved into the drying chamber and prevent a large quantity of moisture from entering into the drying chamber. Thus, the object can be dried by the dry gas supplied into the drying chamber certainly. Therefore, it is possible to effectively make use of a small amount of dry gas without using a great amount of dry gas at a time, whereby the reduction in consumption of dry gas and the improvement in drying efficiency can be accomplished. Additionally, since the volume of the drying chamber can be reduced, it is possible to down-size the apparatus.

What is claimed is:

1. A method for drying an object to be processed in a cleaning and drying apparatus, wherein said apparatus includes:
   a cleaning chamber enclosed with a cleaning bath for storing cleaning liquid in which said object is immersed, said cleaning bath having an upper portion defining an upper opening, and
   a drying chamber enclosed with a case arranged above said cleaning bath and being used only for drying, for supplying the object with gas in order to dry the object, said case having a lower portion defining a lower opening, said lower opening being connected with said upper opening between said case of said drying chamber and said cleaning bath,
   said method comprising the steps of:
      a first drying process step including the steps of:
         supplying a first dry gas into said cleaning chamber after cleaning said object,
         draining said cleaning liquid, wherein said object is fixed in said cleaning chamber,
         while lowering the level of said cleaning liquid, exposing said object to said first dry gas to dry said object to a certain extent, wherein said first dry gas contains volatile organic solvent;
      a moving process step of moving said object to said drying chamber after said first drying process; and
      a second drying process step of supplying a second dry gas into said drying chamber to complete the drying of said object.

2. A cleaning and drying method as claimed in claim 1, wherein said moving step of moving said object to said drying chamber is carried out after said cleaning liquid has been drained.

3. A cleaning and drying method as claimed in claim 1, wherein said moving step of moving said object to said drying chamber is carried out after a level of said cleaning liquid has been lowered below said object to be processed.

4. A cleaning and drying method as claimed in claim 1, wherein said cleaning and drying apparatus further includes a shutter located between said cleaning chamber and said drying chamber for insulating said cleaning chamber and said drying chamber from each other, further comprising the step of closing said shutter while drying said object in said drying chamber.

5. A cleaning and drying method as claimed in claim 4, further comprising the step of substituting new cleaning liquid for used cleaning liquid in said cleaning chamber during said second drying process.

6. A cleaning and drying method as claimed in claim 1, wherein said cleaning and drying apparatus further includes a shutter located between said cleaning chamber and said drying chamber for insulating said cleaning chamber and said drying chamber from each other, further comprising the step of closing said shutter while drying said object in said cleaning chamber.

7. A cleaning and drying method as claimed in claim 1, wherein said cleaning and drying apparatus further includes a shutter located between said cleaning chamber and said drying chamber for insulating said cleaning chamber and said drying chamber from each other, further comprising the step of closing said shutter except when said object is being moved between said cleaning chamber and said drying chamber.

8. A cleaning and drying method as claimed in claim 1, wherein said second dry gas is chosen according to the result of said first drying process, wherein said second dry gas is inert gas or inert gas with volatile organic solvent.

9. A cleaning and drying method as claimed in claim 1, wherein said second dry gas is supplied into said drying chamber to create an atmosphere of dry gas during the first drying process, before the second drying process has commenced.

10. A method of drying an object to be processed in a cleaning and drying apparatus, wherein said apparatus includes:
    a cleaning chamber enclosed with a cleaning bath for storing cleaning liquid in which said object is immersed, said cleaning bath having an upper portion defining an upper opening, and
    a drying chamber enclosed with a case arranged above said cleaning bath and being used only for drying, for supplying the object with gas in order to dry the object, said case having a lower portion defining a lower opening, said lower opening being connected with said upper opening between said case of said drying chamber and said cleaning bath,
    said method comprising the steps of:
       a first drying process step including the steps of:
          supplying a first dry gas into said cleaning chamber after cleaning said object,
          draining said cleaning liquid, wherein said object is fixed in said cleaning chamber,
          while lowering the level of said cleaning liquid, exposing said object to said first dry gas to dry said object to a certain extent, wherein said first dry gas contains volatile organic solvent;
       a moving process step of moving said object to said drying chamber after said first drying process; and
       a second drying process step including the steps of:
          blowing a second dry gas against said object while moving said object from said cleaning chamber to said drying chamber,
          supplying a third dry gas into said drying chamber to complete the drying of said object.

11. A method of drying an object to be processed in a cleaning and drying apparatus, wherein said apparatus includes:
    a cleaning chamber enclosed with a cleaning bath for storing cleaning liquid in which said object is immersed, said cleaning bath having an upper portion defining an upper opening, and
    a drying chamber enclosed with a case arranged above said cleaning bath and being used only for drying, for supplying the object with gas in order to dry the object, said case having a lower portion defining a lower opening, said lower opening being connected with said upper opening between said case of said drying chamber and said cleaning bath,
    said method comprising the steps of:
       a first drying process step including the steps of:
          supplying a first dry gas into said cleaning chamber after cleaning said object,
          draining said cleaning liquid, wherein said object is fixed in said cleaning chamber,
          while lowering the level of said cleaning liquid, exposing said object to said first dry gas to dry said object to a certain extent, wherein said first dry gas contains volatile organic solvent;

a moving process step of moving said object to said drying chamber after said first drying process; and a second drying process step of supplying a second dry gas into said drying chamber to complete the drying of said object, wherein said second dry gas contains volatile organic solvent and inert gas.

12. A cleaning and drying method as claimed in claim 1, wherein said second dry gas is supplied into said drying chamber to create an atmosphere of dry gas during the first drying process, before the second drying process has commenced.

13. A method of drying an object to be processed in a cleaning and drying apparatus, wherein said apparatus includes:

a cleaning chamber enclosed with a cleaning bath for storing cleaning liquid in which said object is immersed, said cleaning bath having an upper portion defining an upper opening, and a drying chamber enclosed with a case arranged above said cleaning bath and being used only for drying for supplying the object with gas in order to dry the object, said case having a lower portion defining a lower opening, said lower opening being connected with said upper opening between said case of said drying chamber and said cleaning bath, said method comprising the steps of:

a first drying process step including the steps of:

supplying a first dry gas into said cleaning chamber after cleaning said object, draining said cleaning liquid, wherein said object is fixed in said cleaning chamber, while lowering the level of said cleaning liquid, exposing said object to said first dry gas to dry said object to a certain extent, wherein said first dry gas contains volatile organic solvent;

a moving process step of moving said object to said drying chamber after said first drying process; and a second drying process step of supplying a second dry gas into said drying chamber to complete the drying of said object, wherein said second dry gas is inert gas.

* * * * *